(12) United States Patent
Dwivedi et al.

(10) Patent No.: US 11,588,477 B2
(45) Date of Patent: Feb. 21, 2023

(54) PULSE STRETCHER CIRCUITRY

(71) Applicant: Arm Limited, Cambridge (GB)

(72) Inventors: Shri Sagar Dwivedi, San Jose, CA (US); Fakhruddin Ali Bohra, San Jose, CA (US); Lalit Gupta, Cupertino, CA (US); Yew Keong Chong, Austin, TX (US); Gus Yeung, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/128,800

(22) Filed: Dec. 21, 2020

(65) Prior Publication Data
US 2021/0111711 A1    Apr. 15, 2021

Related U.S. Application Data

(63) Continuation of application No. 16/026,946, filed on Jul. 3, 2018, now Pat. No. 10,873,324.

(51) Int. Cl.
*H03K 5/06* (2006.01)
*G06F 12/0804* (2016.01)

(52) U.S. Cl.
CPC ........... *H03K 5/06* (2013.01); *G06F 12/0804* (2013.01)

(58) Field of Classification Search
CPC ........... G11C 7/22; G11C 7/222; G11C 7/225; G11C 7/1027; G11C 7/1087; G11C 8/18; G11C 7/1072
See application file for complete search history.

(56) References Cited

U.S. PATENT DOCUMENTS

| | | | | |
|---|---|---|---|---|
| 2004/0219745 A1* | 11/2004 | Park | ........................ | G11C 8/18 438/239 |
| 2008/0037338 A1* | 2/2008 | Chen | ...................... | G11C 7/222 365/194 |
| 2015/0109049 A1* | 4/2015 | Huang | ..................... | G11C 7/22 327/513 |
| 2017/0299651 A1* | 10/2017 | Clerc | .................. | G01R 31/3016 |

* cited by examiner

*Primary Examiner* — Seokjin Kim
(74) *Attorney, Agent, or Firm* — Pramudji Law Group PLLC; Ari Pramudji

(57) ABSTRACT

Various implementations described herein are directed to an integrated circuit having clock generation circuitry that receives an input clock signal and provides a first clock signal having a first pulse width. The integrated circuit includes first pulse-stretching circuitry coupled between the clock generation circuitry and input latch control circuitry. The first pulse-stretching circuitry receives the first clock signal and provides a second clock signal to the input latch control circuitry based on an enable signal. The second clock signal has a second pulse width that is at least greater than the first pulse width. The integrated circuit may include second pulse-stretching circuitry coupled between the clock generation circuitry and read-write circuitry. The second pulse-stretching circuitry provides a third clock signal to the read-write circuitry based on the enable signal. The third clock signal has a third pulse width that is at least greater than the first pulse width.

20 Claims, 8 Drawing Sheets

PULSE STRETCHER CIRCUITRY

RELATED CASES

This application is a continuation of patent application No. U.S. Ser. No. 16/026,946, filed 2018 Jul. 3, the entire disclosure of which is incorporated herein by reference.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional memory circuitry, a race condition exists between an input clock signal and an input data signal when the input clock signal fails to change polarity during read/write operations in an address row driver. Typically, the input clock signal can refer to a global timing pulse (gtp), and at the falling edge of global timing pulse (gtp) when a latch becomes transparent, there can be a race between the input clock signal and the input data signal. In this instance, the address row driver should be turned off before arrival of a new input clock signal and/or a new input data signal. However, conventional memory circuitry does not correct this race condition.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to pulse stretcher circuitry for memory applications, which may be achieved with a mechanism to fix an internal hold margin through an external pin. In some implementations, a similar mechanism may be used to fix an external hold margin through the external pin.

Various implementations of pulse stretcher circuitry for memory applications will now be described in greater detail herein with reference to FIGS. 1A-6.

Figure 1A:
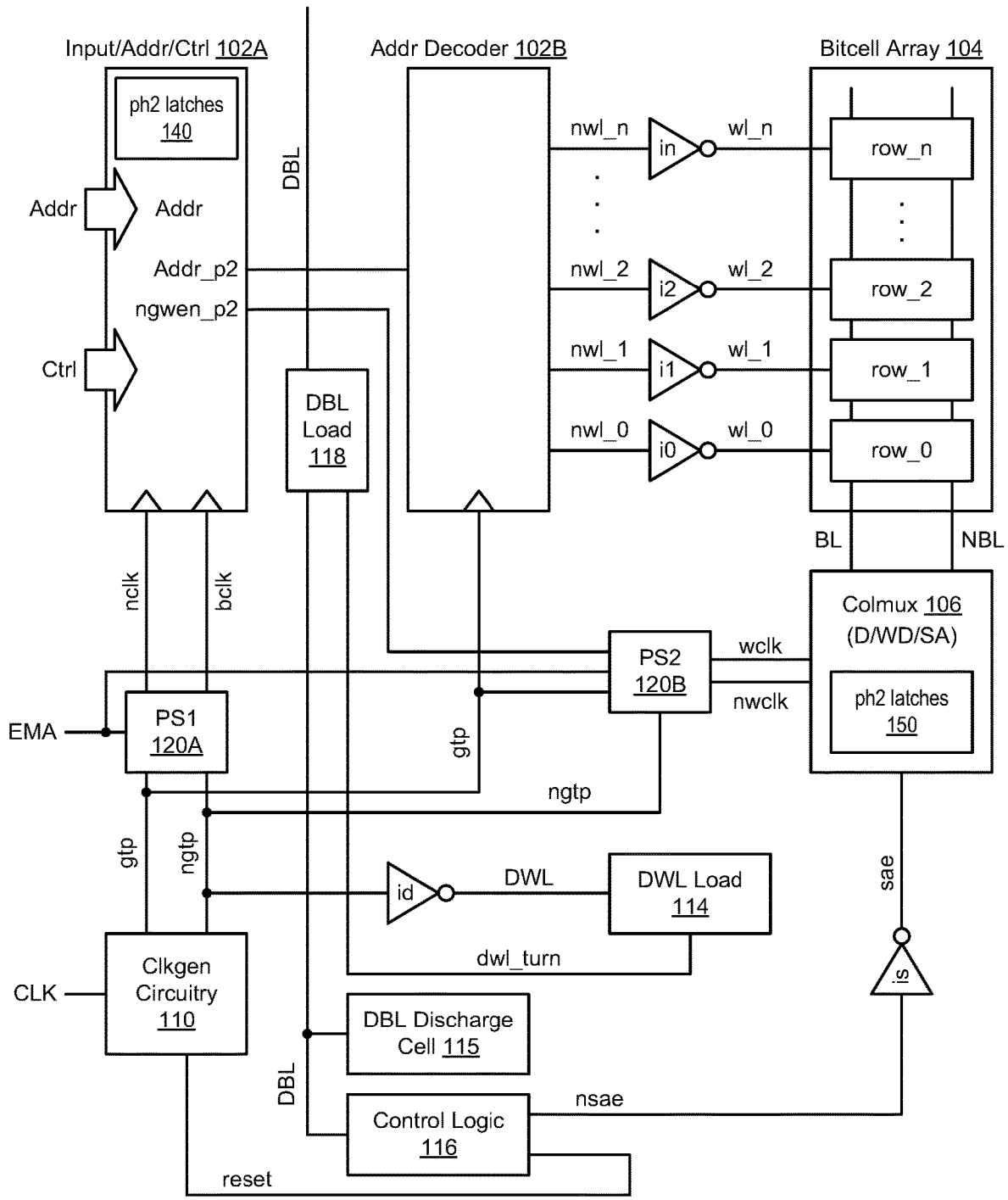
FIG. 1A illustrates a diagram of memory circuitry in accordance with various implementations described herein.
Figure 1B:
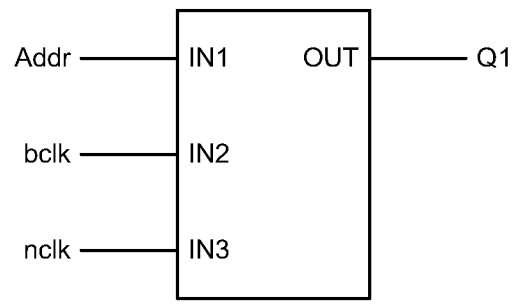
FIGS. 1B and 1C illustrate various diagrams of phase 2 (ph2) latch circuitry in accordance with various implementations described herein.
Figure 1C:
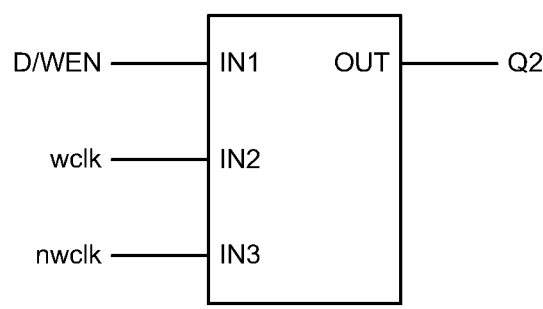

FIG. 1A illustrates a block diagram of memory circuitry 100 in accordance with various implementations described herein. In association with FIG. 1A, FIGS. 1B and 1C illustrate various block diagrams of phase 2 (ph2) latch circuitry in accordance with various implementations described herein.

As shown in FIG. 1A, the memory circuitry 100 may include various circuitry including input/address/control circuitry 102A, address decoder circuitry 102B, an array of bitcells 104, column multiplexer circuitry 106, clock generation circuitry 110, first pulse stretching circuitry (PS1) 120A (or first pulse stretcher), and second pulse stretching (PS2) circuitry 120B (or second pulse stretcher). In some implementations, the array of bitcells 104 may be implemented with multiple rows of bitcells row_0, row_1, row_2, . . . , row_n that are arranged in multiple columns. In this instance, the column multiplexer circuitry 106 may be coupled to each column of bitcells in each of the rows of bitcells row_0, row_1, row_2, . . . , row_n via complementary bitlines (BL, NBL). Also, as shown, the memory circuitry 100 may include a number of inverted wordlines (e.g., nwl_0, nwl_1, nwl_2, . . . , nwl_n) that are coupled between the address decoder 102 and corresponding rows of bitcells row_0, row_1, row_2, . . . , row_n for access to each of the bitcells based on a selected wordline (WL). Further, each of the inverted wordlines nwl_0, nwl_1, nwl_2, . . . , nwl_n has a corresponding wordline driver (e.g., inverters i0, i1, i2, . . . , in) coupled thereto to provide wordlines signals (e.g., wl_0, wl_1, wl_2, . . . wl_n) to the corresponding rows of bitcells row_0, row_1, row_2, . . . , row_n.

The memory circuitry 100 receives clock signals (CLK), address signals (Addr), and control signals (Ctrl). As shown in FIG. 1A, the clock generation circuitry (Clkgen) 110 receives the clock signal (CLK) as an input clock signal and provides one or more internal clock signals (gtp, ngtp) having a first pulse width to various circuitry, such as, e.g., a first clock signal (gtp) to the address decoder 102B and a complementary first clock signal (ngtp) to a dummy wordline driver (e.g., inverter id) via a dummy wordline (DWL). Also, the clock generation circuitry (Clkgen) 110 may provide the clock signals (gtp, ngtp) having the first pulse width to a first pulse stretcher 120A (PS1) and a second pulse stretcher 120B (PS2). Further, the clock generation circuitry (Clkgen) 110 may receive a reset signal (reset) from control logic circuitry 116 as another input signal. Thus, in some instances, the clock generation circuitry (Clkgen) 110 may provide the first and second clock signals (gtp, ngtp) based on at least one of the input clock signal (CLK) and/or the reset signal (reset). The first clock signal (gtp) may refer to a first global timing pulse, and the complementary first clock signal (ngtp) may refer to a second global timing pulse that is complementary to the first global timing pulse (gtp).

The input/address/control circuitry 102A may receive multiple input signals from an external source including, e.g., the input address signals (Addr) and the control signals (Ctrl) and then provide a latched address signal (Addr_p2) to the address decoder 102B and also provide a latched write enable signal (ngwen_p2) to the second pulse stretcher 120B (PS2). The input/address/control circuitry 102A may also receive one or more clock signals (bclk, nclk) from the first pulse stretcher 120A (PS1). The input/address/control circuitry 102A may include one or more first phase 2 (ph2) latches 140, e.g., as shown in FIG. 1B, wherein the first ph2 latches 140 may receive multiple input signals (IN1: Addr, IN2: bclk, IN3: nclk) and provide at least one latched output signal (OUT: Q1). In some instances, the first pulse stretching circuitry 120A (PS1) may include multiple first logic devices (e.g., multiple ph2 latches 140) that are arranged to receive the first global timing pulse (gtp) signal and the second global timing pulse (ngtp) signal. Further, the first pulse stretching circuitry 120A (PS1) may provide the second clock signal (bclk) and the inverted second clock signal (nclk) to the input latch control circuitry 102A based on the enable signal (EMA). In some instances, the second clock signal (bclk) and the inverted second clock signal (nclk) may have a pulse width that has a delayed falling (bclk) edge and a delayed rising (nclk) edge, respectively.

The address decoder 102B may receive multiple signals including, e.g., an address signal (Addr_p2) from the input/address/control circuitry 102A and the first clock signal (gtp) and then access at least one inverted wordline (e.g., nwl_0, nwl_1, nwl_2, . . . , nwl_n) based on the received address signal (Addr_p2), which may be a latched address signal, as described herein above. In this instance, an opening edge of the phase 2 (ph2) latch may be controlled with the enable signal (EMA). In other instances, the closing edge of the phase 2 (ph2) latch may be controlled with the enable signal (EMA). Also, the pulse width of the phase 2 (ph2) latch may have a delayed falling edge or a delayed ph2 latch opening edge. The opening edge and the falling edge of a pulse may be the same, and the closing edge and the rising edge of a pulse may be the same.

In some implementations, the memory circuitry 100 may include dummy bitline (DBL) circuitry and dummy wordline (DWL) circuitry. As shown in FIG. 1A, the dummy bitline (DBL) circuitry may include control logic circuitry 116 coupled between a dummy bitline (DBL) and a reset signal line (reset), and the clock generation circuitry 110 may provide a reset signal to the control logic circuitry 116 via the reset signal line (reset). The dummy bitline (DBL) circuitry may also include a dummy bitline (DBL) discharge cell 115 coupled to the dummy wordline (DWL). The control logic circuitry 116 and a dummy bitline (DBL) load 118 are coupled to the dummy bitline (DBL). As shown, the control logic circuitry 116 may be coupled to the column multiplexer circuitry 106 via another inverter (is). Also, the control circuitry 116 may provide an inverted sense amplifier enable signal (nsae) to the inverter (is), and the inverter (is) may then provide a complementary sense amplifier enable signal (sae) to the column multiplexer circuitry 106. The dummy wordline (DWL) circuitry may include a dummy wordline (DWL) driver (id) and a dummy wordline (DWL) load 114 coupled to the dummy wordline (DWL). As shown, the second clock signal (ngtp) is provided as an input to the dummy wordline driver (e.g., inverter id) via the dummy wordline (DWL), which is coupled to the dummy wordline (DWL) load 114 and the dummy bitline (DBL) load 118 via the dwl_turn signal line.

The column multiplexer circuitry 106 may include input data (D) circuitry, write driver (WD) circuitry, and sense amplifier (SA) circuitry. The column multiplexer circuitry 106 may be referred to as read-write circuitry that includes one or more of the input data (D) circuitry, write enable (WEN) pin circuitry, and the ph2 (phase 2) latch circuitry 150, e.g., as described in reference to FIG. 1C. In some instances, the column multiplexer circuitry 106 may be referred to as read-write circuitry that may be used, e.g., as a column multiplexer (colmux) along with a write driver (WD) for write operations and a sense amplifier (SA) for read operations. Also, the read-write circuitry may be used for fixing an external hold with the enable signal (EMA) as an external control signal. Also, the column multiplexer circuitry 106 may include one or more second phase 2 (ph2) latches 150, e.g., as shown in FIG. 1C, wherein the second ph2 latches 150 may receive multiple input signals (IN1: D/WEN, IN2: wclk, IN3: nwclk) and provide at least one latched output signal (OUT: Q2). The first ph2 latches 140 and the second ph2 latches 150 are described in greater detail herein in reference to FIGS. 1B, 1C, respectively.

The first pulse stretching circuitry 120A (PS1: first pulse stretcher) may be coupled between the clock generation circuitry 110 and the input/address/control circuitry 102A, which may be referred to as input latch control circuitry and/or input ph2 (phase 2) latch control circuitry, as described herein above. The first pulse stretching circuitry 120A (PS1) may receive the first clock signal (gtp) and provide a second clock signal (bclk) to the input latch control circuitry 102A based on an enable signal (EMA), which may refer to an extra margin adjustment signal. The second clock signal (bclk) may have a second pulse width that is at least greater than the first pulse width. The first pulse stretching circuitry 120A (PS1) may also provide an inverted second clock signal (nclk) to the input latch control circuitry 102A based on the enable signal (EMA).

Further, the second pulse stretching circuitry 120B (PS2: second pulse stretcher) may be coupled between the clock generation circuitry 110 and the read-write circuitry 106, which may be referred to as the column multiplexer circuitry 106. The second pulse stretching circuitry 120B (PS2) may provide a third clock signal (wclk) to the read-write circuitry 106 based on the enable signal (EMA). The third clock signal (wclk) may refer to a write clock signal, and the third clock signal (wclk) may have a third pulse width that is at least greater than the first pulse width. In some instances, the third clock signal (wclk) may have a pulse width that has a delayed falling edge.

In some implementations, the first clock signal (gtp) may be implemented with a first global timing pulse (gtp) signal, and the clock generation circuitry 110 may provide the first global timing pulse (gtp) signal to the first pulse stretching circuitry 120A (PS1) and the second pulse stretching circuitry 120B (PS2). The clock generation circuitry 110 may provide the second global timing pulse signal (ngtp) to the first pulse stretching circuitry 120A (PS1) and the second pulse stretching circuitry 120B (PS2). The second global timing pulse (ngtp) signal is a complement of the first global timing pulse (gtp) signal. The first pulse stretching circuitry 120A (PS1) may receive the first global timing pulse (gtp) signal and the second global timing pulse (ngtp) signal and provide the second clock signal (bclk) to the input latch control circuitry based on the enable signal (EMA). The first pulse stretching circuitry 120A (PS1) may also provide an inverted second clock signal (nclk) to the input latch control circuitry 102A based on the enable signal (EMA). The second pulse stretching circuitry 120B (PS2) may receive the first global timing pulse (gtp) signal, the second global timing pulse (ngtp) signal, and a write enable (WEN) signal and provide the third clock signal (wclk) to the read-write circuitry 106 based on the enable signal (EMA). Further, the second pulse stretching circuitry 120B (PS2) may also provide an inverted third clock signal (nwclk) to the read-write circuitry 106 based on the enable signal (EMA). The second pulse stretching circuitry 120B (PS2) may receive the write enable (WEN) signal from the input latch control circuitry 102A. The inverted third clock signal (nwclk) may have a pulse width that has a delayed falling edge.

In various implementations, each bitcell in the array of bitcells 104 may also be referred to as a memory cell, and each bitcell may be configured to store at least one data bit value (e.g., a data value associated with logical '0' or '1'). Each row of bitcells row_0, row_1, row_2, . . . , row_n in the array of bitcells 104 may include any number of bitcells or memory cells arranged in various configurations, such as, e.g., a two-dimensional (2D) memory array having columns and rows of multiple bitcells arranged in a 2D grid pattern with 2D indexing capabilities. Also, each bitcell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation. Further, each bitcell in the array of bitcells 104 may be accessed with a wordline WL and complementary bitlines BL, NBL.

Generally, static RAM bitcells may include 6T bitcells, which may have access ports controlled by wordlines (WLs). In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in a left half array and a right half array.

The memory circuitry 100 including each bitcell in the array of bitcells 104 may be implemented as an integrated circuit (IC) with various types of memory circuitry, such as, e.g., random access memory (RAM), and/or any other types of memory, including any type of volatile memory and non-volatile memory. Also, the memory circuitry 100 may be implemented as an IC with single and/or dual rail memory architectures, and the memory circuitry 100 may also be integrated with computing circuitry and related components on a single chip. Further, the memory circuitry 100 may be implemented in an embedded system for various types of electronic, mobile, and/or biometric applications.

Figure 2:
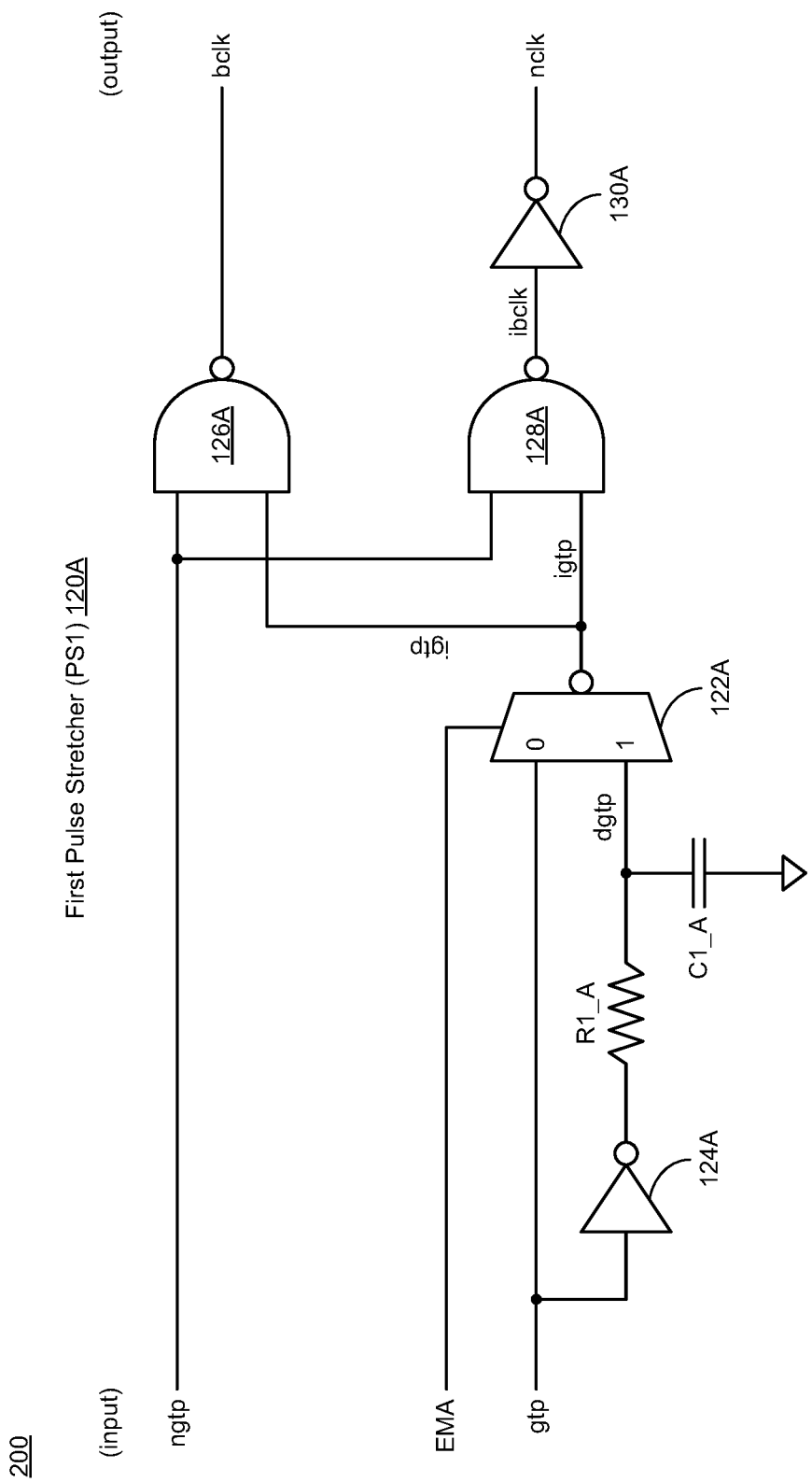
FIG. 2 illustrates a diagram of first pulse stretching circuitry in accordance with various implementations described herein.

FIG. 2 illustrates a diagram 200 of the first pulse stretching circuitry 120A in accordance with various implementations described herein. In some instances, the first pulse stretching circuitry 120A may be referred to as a first pulse stretcher.

As shown in FIG. 2, the first pulse stretching circuitry 120A (PS1) may receive the first global timing pulse (gtp) signal and the second global timing pulse (ngtp) signal and provide the second clock signal (bclk) to the input latch control circuitry 102A based on the enable signal (EMA). As also shown, the first pulse stretching circuitry 120A (PS1) may provide the inverted second clock signal (nclk) to the input latch control circuitry 102A based on the enable signal (EMA). In this instance, the first pulse stretching circuitry 120A (PS1) may be used to provide a mechanism for controlling the first phase 2 (ph2) latches 140 in FIGS. 1A, 1B based on the enable signal (EMA).

The first pulse stretching circuitry 120A may include multiple first logic devices that are arranged to receive the first global timing pulse (gtp) signal and the second global timing pulse (ngtp) signal and provide the second clock signal (bclk) and the inverted second clock signal (nclk) to the input latch control circuitry 102A based on the enable signal (EMA). The first pulse stretching circuitry 120A may include a first multiplexer 122A of the multiple first logic devices that receives the global timing pulse (gtp) at a first input (0). Also, the first pulse stretching circuitry 120A may include first resistor-capacitor (RC) circuitry (R1_A, C1_A) that receives the first global timing pulse (gtp), delays the first global timing pulse (gtp), and provides a delayed first global timing pulse (dgtp) to a second input (1) of the first multiplexer 122A of the multiple first logic devices. As shown, the first multiplexer 122A may provide a first intermediate global timing pulse (igtp) to one or more other logic devices (126A, 128A) of the multiple first logic devices based on the enable signal (EMA). As shown, the first multiplexer 122A has an inverted output.

The one or more other logic devices (126A, 128A) of the multiple first logic devices may be arranged to receive the second global timing pulse (ngtp) and the first intermediate global timing pulse (igtp) and provide the second clock signal (bclk) to the input latch control circuitry 102A (FIG. 1A). For instance, the one or more other logic devices (126A, 128A) may include a NAND gate 126A that receives the second global timing pulse (ngtp) and the first intermediate global timing pulse (igtp) and provides the second clock signal (bclk) to the input latch control circuitry 102A (FIG. 1A). In another instance, the one or more other logic devices (126A, 128A) may include another NAND gate 128A that receives the second global timing pulse (ngtp) and the first intermediate global timing pulse (igtp) and provides the inverted second clock signal (nclk) to the input latch control circuitry 102A (FIG. 1A) via an inverter 130A. In this instance, the NAND gate 128A provides another intermediate signal (ibclk) to the inverter 130A, and then the inverter 130A provides the inverted second clock signal (nclk) to the input latch control circuitry 102A (FIG. 1A).

Figure 3:
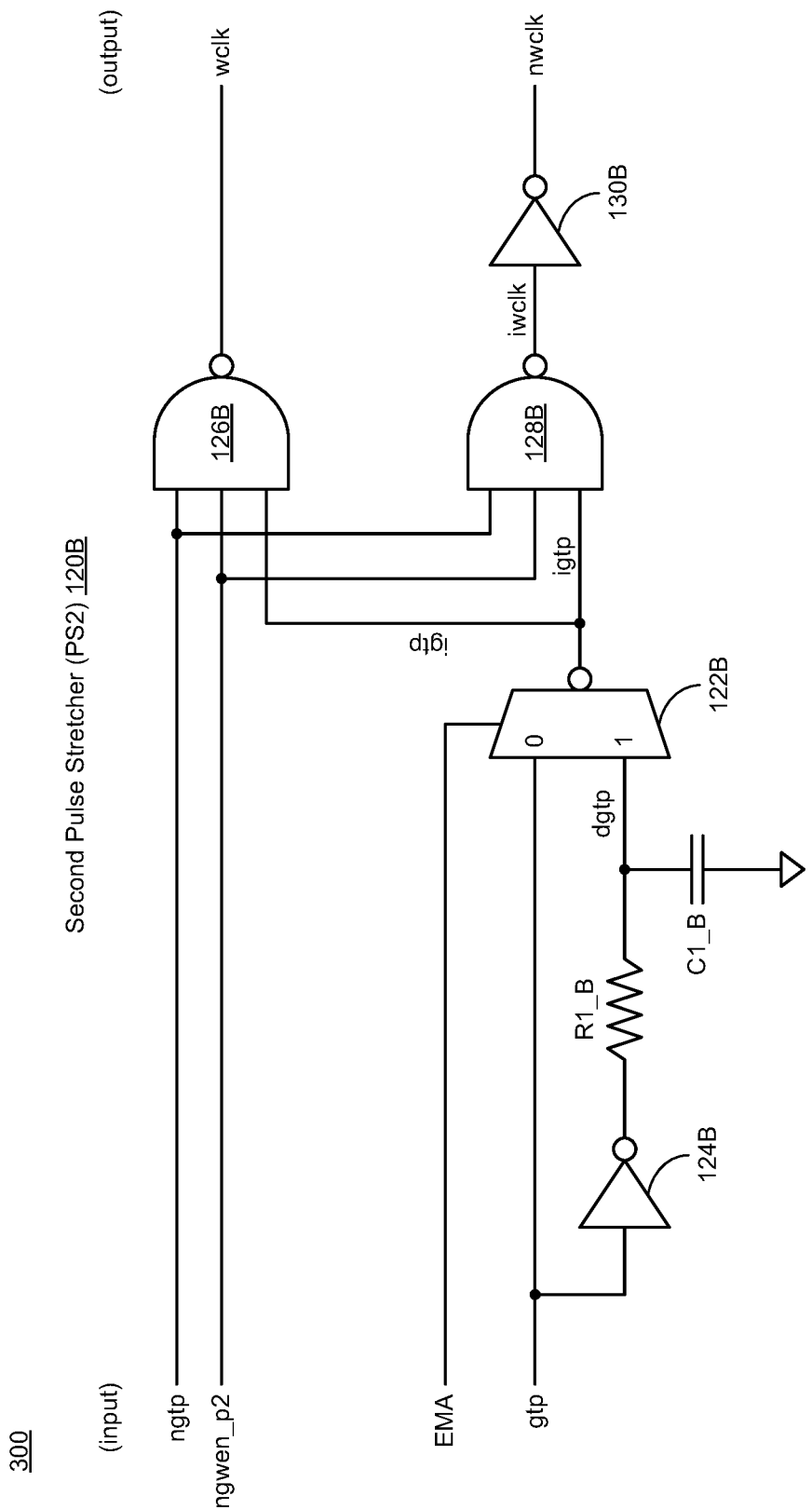
FIG. 3 illustrates a diagram of second pulse stretching circuitry in accordance with various implementations described herein.

FIG. 3 illustrates a diagram 300 of the second pulse stretching circuitry 120B in accordance with various implementations described herein. In some instances, the second pulse stretching circuitry 120B may be referred to as a second pulse stretcher.

As shown in FIG. 3, the second pulse stretching circuitry 120B (PS2) may receive the first global timing pulse (gtp) signal, the second global timing pulse (ngtp) signal, and the write enable (ngwen_p2) signal and provide the third clock signal (wclk) to the read-write circuitry 106 based on the enable signal (EMA). As also shown, the second pulse stretching circuitry 120B (PS2) may provide the inverted third clock signal (nwclk) to the read-write circuitry 106 based on the enable signal (EMA). Also, the second pulse stretching circuitry 120B (PS2) may receive the write enable (ngwen_p2) signal from the input latch control circuitry 102A. In this instance, the second pulse stretching circuitry 120B (PS2) may be used to provide a mechanism for controlling the second phase 2 (ph2) latches 150 in FIGS. 1A, 1C based on the enable signal (EMA).

The second pulse stretching circuitry 120B may include multiple second logic devices that are arranged to receive the first global timing pulse (gtp) signal, the second global timing pulse (ngtp) signal, and the write enable signal (ngwen_p2) and provide the third clock signal (wclk) and the inverted third clock signal (nwclk) to the read-write circuitry 106 based on the enable signal (EMA). The second pulse stretching circuitry 120B may include a second multiplexer 122B of the multiple second logic devices that receives the global timing pulse (gtp) at a first input (0). Also, the second pulse stretching circuitry 120B may include second resistor-capacitor (RC) circuitry (R1_B, C1_B) that receives the first global timing pulse (gtp), delays the first global timing pulse (gtp), and provides a delayed first global timing pulse (dgtp) to a second multiplexer 122B of the multiple second logic devices. As shown, the second multiplexer 122B may provide a second intermediate global timing pulse (igtp) to one or more other logic devices (126B, 128B) of the multiple second logic devices based on the enable signal (EMA). As shown, the second multiplexer 122B has an inverted output.

The one or more other logic devices (126B, 128B) of the multiple second logic devices may be arranged to receive the second global timing pulse (ngtp), the write enable signal (ngwen_p2), and the second intermediate global timing pulse (igtp) and provide the third clock signal (wclk) and the inverted third clock signal (nwclk) to the read-write circuitry 106 (FIG. 1A). For instance, the one or more other logic devices (126B, 128B) may include a NAND gate 126B that receives the second global timing pulse (ngtp), the write enable signal (ngwen_p2), and the second intermediate global timing pulse (igtp) and provides the third clock signal (wclk) to the read-write circuitry 106 (FIG. 1A). In another instance, the one or more other logic devices (126B, 128B) may include another NAND gate 128B that receives the second global timing pulse (ngtp), the write enable signal (ngwen_p2), and the second intermediate global timing pulse (igtp) and provides the inverted third clock signal (nwclk) to the read-write circuitry 106 (FIG. 1A) via an inverter 130B. In this instance, the NAND gate 128B provides another intermediate signal (iwclk) to the inverter 130B, and then the inverter 130B provides the inverted third clock signal (nwclk) to the read-write circuitry 106 (FIG. 1A).

In reference to FIGS. 1A-3, the various implementations described herein may provide various advantages as follows. For instance, there may be no impact on access time and external hold time. In another instance, there may be added flexibility to switch a state of the enable signal (EMA) from 0-to-1 at an overdrive corner, which may favorably impact cycle time (e.g., the latch clock pulse width plus setup time).

Figure 4A:
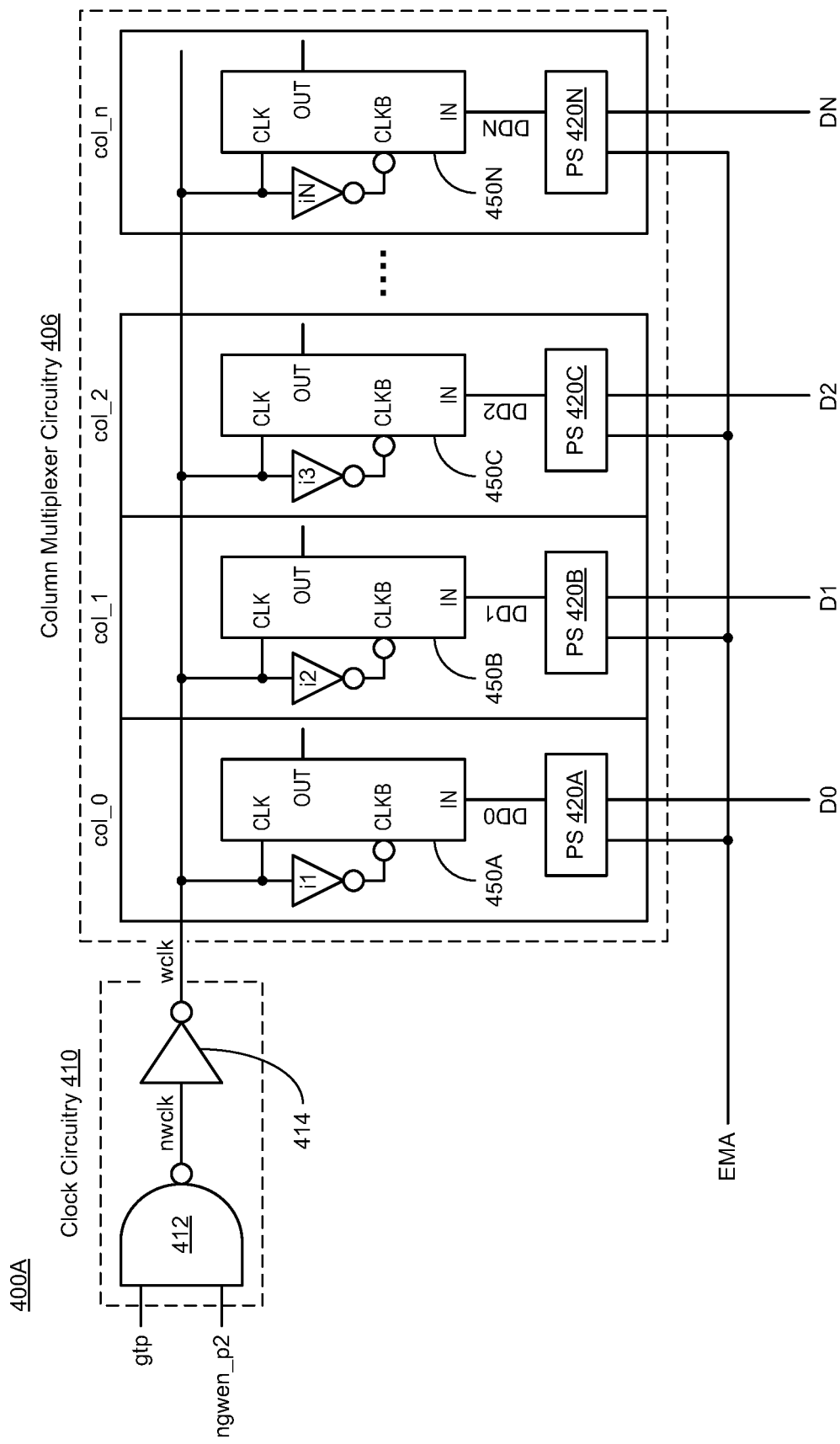
FIG. 4A illustrates a diagram of column multiplexer circuitry in accordance with various implementations described herein.
Figure 4B:
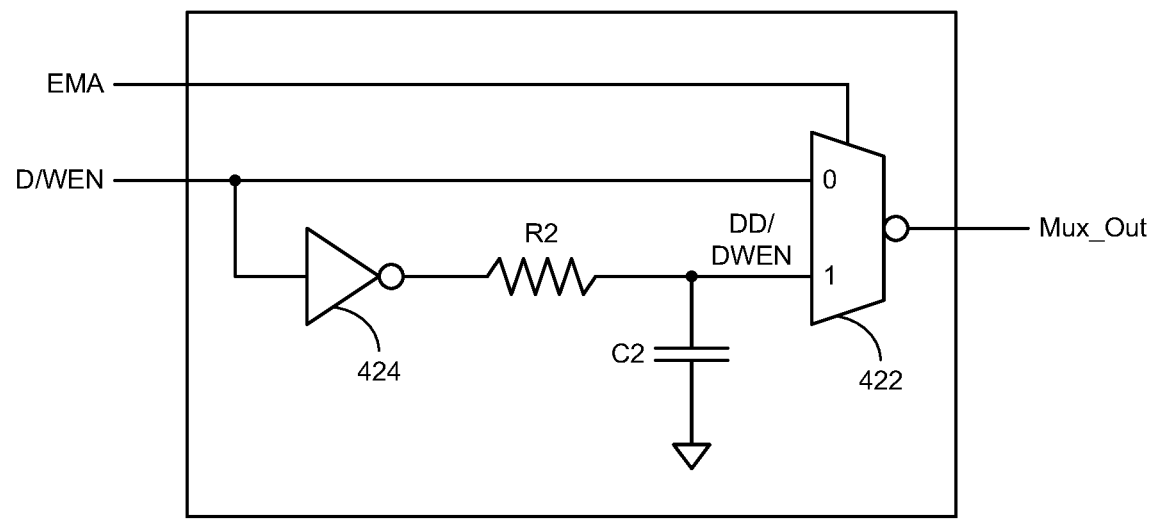
FIG. 4B illustrates a diagram of pulse stretching circuitry in accordance with various implementations described herein.

FIG. 4A illustrates a block diagram 400A of column multiplexer circuitry 406 in accordance with various implementations described herein. FIG. 4B illustrates a diagram of pulse stretching circuitry 420 in accordance with various implementations described herein. The pulse stretching circuitry 420 shown in FIG. 4B may be used to implement the pulse stretching circuitry 420A, 420B, 420C, . . . , 420N in FIG. 4A.

As shown in FIG. 4A, the column multiplexer circuitry 406 may include one or more logic devices 450A, 450B, 450C, . . . , 450N that receive multiple input clock signals (CLKA, CLKB), generate a column enable signal (OUT) associated with the multiple input clock signals (CLKA, CLKB), and provide the column enable signal (OUT) based on a delayed input data signal (IN: DD0, DD1, DD2, . . . , DDN). In some instances, the one or more the logic devices 450A, 450B, 450C, . . . , 450N may be implemented with one or more latches, such as, e.g., phase 2 (ph2) latches. Also, the multiple input clock signals (CLKA, CLKB) may refer to a write clock signal (wclk) and a delayed (or inverted) write clock signal (nwclk). The one or more latches may receive the write clock signal (wclk) and the delayed write clock signal (nwclk) and provide the column enable signal (OUT) as a latched column enable signal based on the delayed input data signal (IN: DD0, DD1, DD2, . . . , DDN) for each column (col_0, col_1, col_2, . . . , col_n), respectively.

The column multiplexer circuitry 406 may utilize pulse stretching (PS) circuitry 420A, 420B, 420C, . . . , 420N that is coupled to the one or more logic devices 450A, 450B, 450C, . . . , 450N of the column multiplexer circuitry 406, respectively. The pulse stretching (PS) circuitry 420A, 420B, 420C, . . . , 420N may receive an input data signal (D0, D1, D2, . . . , DN) and the enable signal (EMA) and provide the delayed input data signal (IN: DD0, DD1, DD2, . . . , DDN) to the one or more logic devices 450A, 450B, 450C, . . . , 450N based on the enable signal (EMA). The input data signal (D0, D1, D2, . . . , DN) may have a first pulse width, and the delayed input data signal (IN: DD0, DD1, DD2, . . . , DDN) may have a second pulse width that is at least greater than the first pulse width. As such, data path control may be achieved through an external pin with the enable signal (EMA).

The column multiplexer circuitry 406 may utilize clock generation circuitry 410 having multiple logic devices 412, 414 that are arranged to receive a global timing pulse (gtp) signal and a write enable signal (ngwen_p2) and provide at least one of the multiple input clock signals (CLKA, CLKB) to the column multiplexer circuitry 406. As shown, the multiple input clock signals (CLKA, CLKB) may include a first input clock signal (CLKA) that refers to a write clock signal (wclk) and second input clock signal (CLKB) that refers to an inverted write clock signal (nwclk). Further, as shown, the multiple logic devices 412, 414 of the clock generation circuitry 410 may be implemented with a NAND gate 412 and an inverter 414. The NAND gate 412 may receive the global timing pulse (gtp) signal and the write enable signal (ngwen_p2) and provide the inverted write clock signal (nwclk), and the inverter 414 may receive the inverted write clock signal (nwclk) and provide the write clock signal (wclk). One or more additional inverters (i1, i2, i3, . . . , iN) may be used to receive the write clock signal (nwclk) from inverter 414 and then provide the inverted write clock signal (nwclk) to the one or more logic devices 450A, 450B, 450C, . . . , 450N of the column multiplexer circuitry 406.

FIG. 4B shows the pulse stretching circuitry 420 as an implementation of the pulse stretching (PS) circuitry 420A, 420B, 420C, . . . , 420N of FIG. 4A. In some cases, the pulse stretching circuitry 420 may be referred to as a pulse stretcher.

As shown in FIG. 4B, the pulse stretching circuitry 420 (or pulse stretcher) may include a third multiplexer 422 that receives the input data signal (D/WEN) at a first input (0) and the delayed input data signal (DD/DWEN) at a second input (1) and provides the delayed input data signal (DD/DWEN) to the one or more logic devices 450A, 450B, 450C, . . . , 450N (FIG. 4A) via Mux_Out based on the enable signal (EMA). As shown, the third multiplexer 422 has an inverted output (Mux_Out).

In some implementations, the pulse stretching circuitry 420 (or pulse stretcher) may include resistor-capacitor (RC) circuitry (R2, C2) that receives the input data signal (D/WEN), delays the input clock signal (D/WEN), and provides the delayed input clock signal (DD/DWEN) to the second input (1) of the third multiplexer 422. As shown in FIG. 4B, the resistor-capacitor (RC) circuitry may include an inverter 424, a resistor (R2), and a capacitor (C2) that are arranged to receive the input data signal (D/WEN), delay the input clock signal (D/WEN), and provide the delayed input clock signal (DD/DWEN) to the second input (1) of the third multiplexer 422.

In reference to FIGS. 4A-4B, the various implementations described herein may provide various advantages as follows. For instance, an external hold may be fixed through an external pin with the enable signal (EMA). Also, in some instances, there may be no impact on cycle time.

Figure 5:
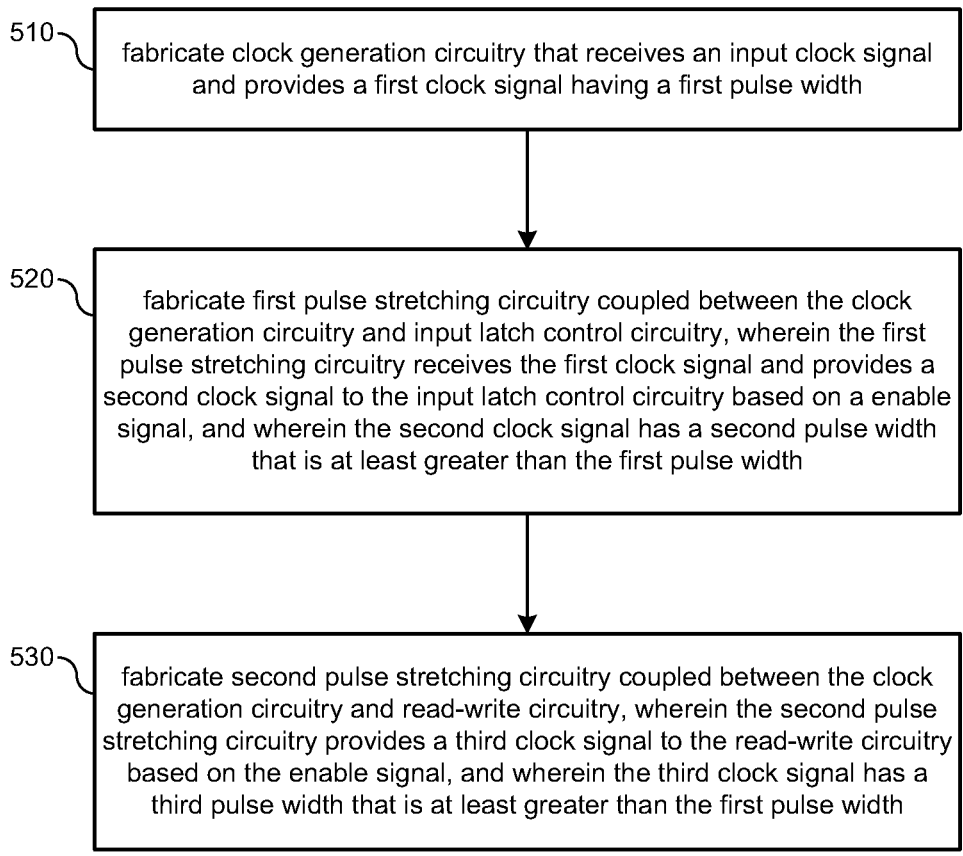
FIG. 5 illustrates a flow diagram of a method of fabricating integrated circuitry in accordance with various implementations described herein.

FIG. 5 illustrates a process flow diagram of a method 500 for fabricating pulse stretcher circuitry for memory applications in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Method 500 may be implemented in hardware and/or software. If implemented in hardware, method 500 may be implemented with various circuit components, as described herein above in reference to FIGS. 1A-4B. If implemented in software, method 500 may be implemented as a program or software instruction process that is configured for fabricating stretcher circuitry for memory applications as described herein. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be used for manufacturing an integrated circuit (IC) that implements pulse stretcher circuitry in various types of memory applications. In some implementations, method 500 may be utilized to implement the circuitry 100A, 100B, 100C, 200, 300 of FIGS. 1A-3.

At block 510, method 500 may fabricate clock generation circuitry that receives an input clock signal and provides a first clock signal having a first pulse width. In some instances, method 500 may fabricate dummy bitline circuitry having control logic that is coupled between a dummy bitline and a reset signal line, and the clock generation circuitry may provide a reset signal to the control logic via the reset signal line.

At block 520, method 500 may fabricate first pulse stretching circuitry coupled between the clock generation circuitry and input latch control circuitry. The first pulse stretching circuitry may receive the first clock signal and provide a second clock signal to the input latch control circuitry based on an enable signal, and the second clock signal may have a second pulse width that is at least greater than the first pulse width. The input latch control circuitry may be implemented with input ph2 latch control circuitry.

At block 530, method 500 may fabricate second pulse stretching circuitry coupled between the clock generation circuitry and read-write circuitry. The second pulse stretching circuitry may provide a third clock signal to the read-write circuitry based on the enable signal, and the third clock signal may have a third pulse width that is at least greater than the first pulse width. The read-write circuitry may include one or more of input data circuitry, write enable pin circuitry and ph2 latch circuitry. The read-write circuitry may include a column multiplexer along with a write driver for write operations and a sense amplifier for read operations, and the read-write circuitry may be used for fixing an external hold with the enable signal as an external control signal.

In some implementations, the first clock signal may include a first global timing pulse signal, and the clock generation circuitry may provide the first global timing pulse signal to the first pulse stretching circuitry and the second pulse stretching circuitry. The clock generation circuitry may provide a second global timing pulse signal to the first pulse stretching circuitry and the second pulse stretching circuitry, and the second global timing pulse signal may be a complement of the first global timing pulse signal. The first pulse stretching circuitry may receive the first global timing pulse signal and the second global timing pulse signal and provide the second clock signal to the input latch control circuitry based on the enable signal. The first pulse stretching circuitry may include multiple first logic devices that are arranged to receive the first global timing pulse signal and the second global timing pulse signal and to provide the second clock signal to the input latch control circuitry based on the enable signal. The first pulse stretching circuitry may further include first RC circuitry that receives the first global timing pulse, delays the first global timing pulse, and provides a delayed first global timing pulse to a first multiplexer of the multiple first logic devices. The first multiplexer may provide a first intermediate global timing pulse to one or more other logic devices of the multiple first logic devices based on the enable signal. The one or more other logic devices of the multiple first logic devices are arranged to receive the second global timing pulse and the first intermediate global timing pulse and provide the second clock signal to the input latch control circuitry.

In some implementations, the second pulse stretching circuitry may receive the first global timing pulse signal, the second global timing pulse signal, and a write enable signal and provides the third clock signal to the read-write circuitry based on the enable signal. The second pulse stretching circuitry may receive the write enable signal from the input latch control circuitry. The second pulse stretching circuitry may include multiple second logic devices that are arranged to receive the first global timing pulse signal, the second global timing pulse signal, and the write enable signal and provide the third clock signal to the read-write circuitry based on the enable signal. The second pulse stretching circuitry may include second RC circuitry that receives the first global timing pulse, delays the first global timing pulse, and provides a delayed first global timing pulse to a second multiplexer of the multiple second logic devices. The second multiplexer may provide a second intermediate global timing pulse to one or more other logic devices of the multiple second logic devices based on the enable signal. The one or more other logic devices of the multiple second logic devices are arranged to receive the second global timing pulse, write enable signal, and the first intermediate global timing pulse and provide the third clock signal to the read-write circuitry.

Figure 6:
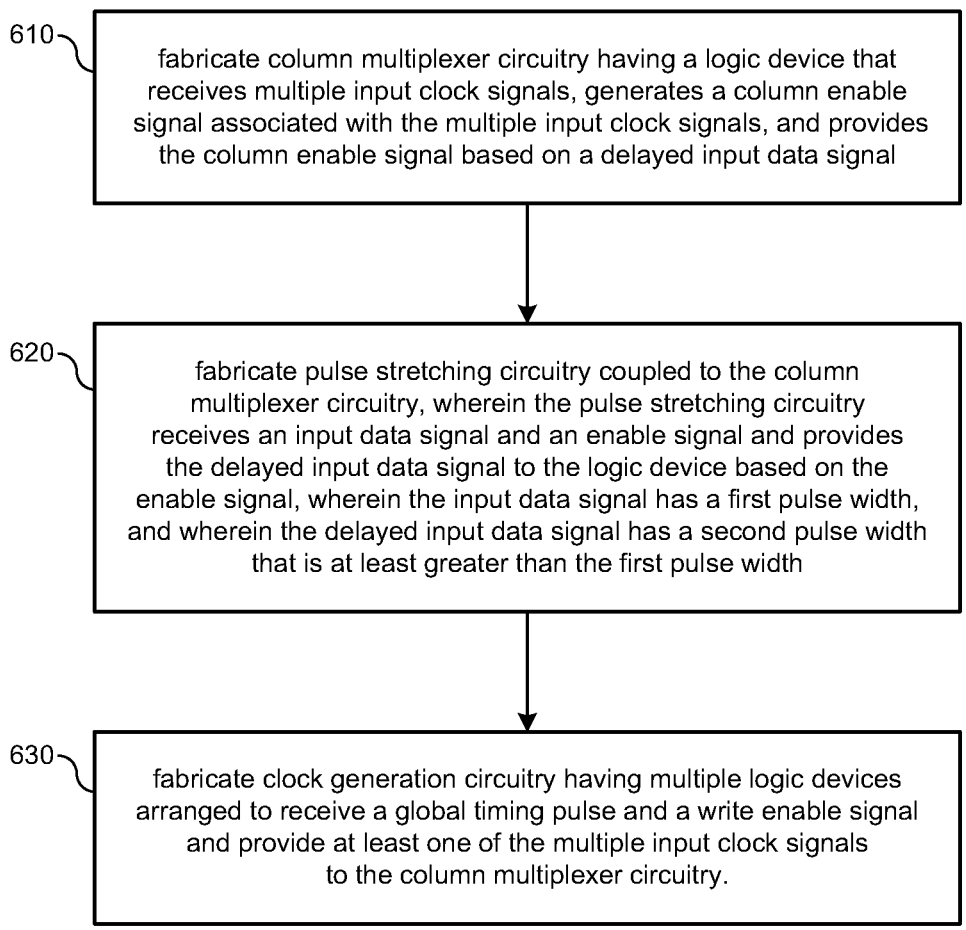
FIG. 6 illustrates a flow diagram of another method of fabricating integrated circuitry in accordance with various implementations described herein.

FIG. 6 illustrates a process flow diagram of a method 600 for fabricating pulse stretcher circuitry for memory applications in accordance with various implementations described herein.

It should be understood that even though method 600 may indicate a particular order of operation execution, in some cases, various certain portions of the operations may be executed in a different order, and on different systems. In other cases, additional operations and/or steps may be added to and/or omitted from method 600. Method 600 may be implemented in hardware and/or software. If implemented in hardware, method 600 may be implemented with various circuit components, as described herein above in reference to FIGS. 1A-4B. If implemented in software, method 600 may be implemented as a program or software instruction process that is configured for fabricating stretcher circuitry for memory applications as described herein. Further, if implemented in software, instructions related to implementing the method 600 may be stored in memory and/or a database. For instance, a computer or various other types of computing devices having a processor and memory may be configured to perform method 600.

As described and shown in reference to FIG. 6, method 600 may be used for manufacturing an integrated circuit (IC) that implements pulse stretcher circuitry in various types of memory applications. In some implementations, method 600 may be utilized to implement the circuitry 400A, 400B of FIGS. 4A and 4B.

At block 610, method 600 may fabricate column multiplexer circuitry having a logic device that receives multiple input clock signals, generates a column enable signal associated with the multiple input clock signals, and provides the column enable signal based on a delayed input data signal. The logic device may be implemented with a latch, and the multiple input clock signals may include a write clock signal and a delayed write clock signal. Also, the latch may receive the write clock signal and the delayed write clock signal and provide the column enable signal as a latched column enable signal based on the delayed input data signal.

At block 620, method 600 may fabricate pulse stretching circuitry coupled to the column multiplexer circuitry. The pulse stretching circuitry may receive an input data signal and an enable signal and provides the delayed input data signal to the logic device based on the enable signal. The input data signal may have a first pulse width, and the delayed input data signal may have a second pulse width that is at least greater than the first pulse width. The pulse stretching circuitry may include a multiplexer that receives the input data signal and the delayed input data signal and provides the delayed multiple input clock signal to the logic device based on the enable signal. The pulse stretching circuitry may include RC circuitry that receives the input data signal, delays the input clock signal, and provides the delayed input clock signal to the multiplexer. In some implementations, the RC circuitry may include an inverter, a resistor, and a capacitor that are arranged to receive the input data signal, delay the input clock signal, and provide the delayed input clock signal to the multiplexer.

At block 630, method 600 may further fabricate clock generation circuitry having multiple logic devices arranged to receive a global timing pulse and a write enable signal and provide at least one of the multiple input clock signals to the column multiplexer circuitry. In some instances, the multiple logic devices of the clock generation circuitry may be implemented with a NAND gate and an inverter.

Described herein are various implementations of an integrated circuit. The integrated circuit may include clock generation circuitry that receives an input clock signal and provides a first clock signal having a first pulse width. The integrated circuit may include first pulse stretching circuitry that is coupled between the clock generation circuitry and input latch control circuitry. The first pulse stretching circuitry may receive the first clock signal and provide a second clock signal to the input latch control circuitry based on an enable signal. The second clock signal may have a second pulse width that is at least greater than the first pulse width. The integrated circuit may include second pulse stretching circuitry that is coupled between the clock generation circuitry and read-write circuitry. The second pulse stretching circuitry may provide a third clock signal to the read-write circuitry based on the enable signal. The third clock signal may have a third pulse width that is at least greater than the first pulse width.

Described herein are various implementations of a method for manufacturing or fabricating an integrated circuit. The method may include fabricating clock generation circuitry that receives an input clock signal and provides a first clock signal having a first pulse width. The method may include fabricating first pulse stretching circuitry that is coupled between the clock generation circuitry and input latch control circuitry. The first pulse stretching circuitry may receive the first clock signal and provide a second clock signal to the input latch control circuitry based on a enable signal. The second clock signal may have a second pulse width that is at least greater than the first pulse width. The method may include fabricating second pulse stretching circuitry that is coupled between the clock generation circuitry and read-write circuitry. The second pulse stretching circuitry may provide a third clock signal to the read-write circuitry based on the enable signal. The third clock signal may have a third pulse width that is at least greater than the first pulse width.

Described herein are various implementations of an integrated circuit. The integrated circuit may include column multiplexer circuitry having a logic device that receives multiple input clock signals, generates a column enable signal associated with the multiple input clock signals, and provides the column enable signal based on a delayed input data signal. The integrated circuit may include pulse stretching circuitry coupled to the column multiplexer circuitry. The pulse stretching circuitry may receive an input data signal and an enable signal and provide the delayed input data signal to the logic device based on the enable signal. The input data signal may have a first pulse width, and the delayed input data signal may have a second pulse width that is at least greater than the first pulse width.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device comprising:
    column multiplexer circuitry that provides a column enable signal based on input clock signals and a delayed input data signal; and
    pulse stretching circuitry that provides the delayed input data signal to the column multiplexer circuitry based on an input data signal and an enable signal,
    wherein the input data signal has a first pulse width, and the delayed input data signal has a second pulse width that is at least greater than the first pulse width.

2. The device of claim 1, wherein:
    the column multiplexer circuitry receives the input clock signals, generates the column enable signal associated with the input clock signals, and provides the column enable signal based on the delayed input data signal,
    the pulse stretching circuitry is coupled to the column multiplexer circuitry, and
    the pulse stretching circuitry receives the input data signal, receives the enable signal, and provides the input data signal or the delayed input data signal to the column multiplexer circuitry based on the enable signal.

3. The device of claim 1, wherein:
    the input clock signals include a write clock signal and a delayed write clock signal,
    the column multiplexer circuitry has a logic device that operates as a latch, and
    the latch receives the write clock signal, receives the delayed write clock signal, and provides the column enable signal as a latched column enable signal based on the write clock signal, the delayed write clock signal, and the delayed input data signal.

4. The device of claim 1, wherein the pulse stretching circuitry receives the input data signal, receives the enable signal, generates the delayed input data signal based on the input data signal, and provides the input data signal or the delayed input data signal to the column multiplexer circuitry based on the enable signal.

5. The device of claim 4, wherein the pulse stretching circuitry includes a multiplexer that receives the input data signal, receives the delayed input data signal, and then provides the input data signal or the delayed input data signal to the column multiplexer circuitry based on the enable signal.

6. The device of claim 5, wherein:
    the multiplexer has a first input, a second input, and a single output, and
    the enable signal is used as a multiplexer selection signal that selectively passes the input data signal from the first input to the single output or that selectively passes the delayed input data signal from the second input to the single output.

7. The device of claim 5, wherein the pulse stretching circuitry has delay circuitry that receives the input data signal, delays the input data signal, and provides the delayed input data signal to the multiplexer.

8. The device of claim 7, wherein the delay circuitry refers to resistor-capacitor (RC) circuitry that receives the input data signal, delays the input data signal, and provides the delayed input data signal to the multiplexer.

9. The device of claim 7, wherein the delay circuitry includes an inverter, a resistor, and a capacitor that are arranged to receive the input data signal, delay the input data signal, and provide the delayed input data signal to the multiplexer.

10. The device of claim 1, further comprising:
    clock generation circuitry having multiple logic devices that are arranged to receive a global timing pulse, receive a write enable signal, and provide one or more of the input clock signals to the column multiplexer circuitry.

11. A pulse stretcher comprising:
a delay element that receives an input data signal at an input node and provides a delayed input data signal at an output node, wherein the delay element has an inverter and a resistor coupled in series between the input node and the output node, and wherein the delay element has a capacitor coupled directly to the output node; and
a multiplexer having a first input and a second input, wherein the multiplexer receives the input data signal directly from the input node of the delay element at the first input, receives the delayed input data signal directly from the output node of the delay element at the second input, and selectively provides the input data signal or the delayed input data signal as output to a latch based on an enable signal.

12. The pulse stretcher of claim 11, wherein:
the multiplexer has a single output,
the resistor is coupled directly to the second input of the multiplexer at the output node of the delay element, and
the enable signal is used as a multiplexer selection signal that selectively passes the input data signal from the first input to the single output or that selectively passes the delayed input data signal from the second input to the single output.

13. The pulse stretcher of claim 11, wherein:
the capacitor is coupled between the output node and ground,
the capacitor is coupled directly to the multiplexer at the output node, and
the delay element refers to resistor-capacitor (RC) circuitry that receives the input data signal at the input node, delays the input data signal, and provides the delayed input data signal to the multiplexer at the output node.

14. The pulse stretcher of claim 11, wherein:
the multiplexer has the first input coupled to the inverter at the input node,
the multiplexer has the second input coupled to the resistor and the capacitor at the output node,
the capacitor is coupled directly to the second input of the multiplexer between the output node and ground, and
the delay element has the inverter, the resistor, and the capacitor arranged and configured to receive the input data signal at the input node, delay the input data signal, and provide the delayed input data signal to the multiplexer at the output node.

15. The pulse stretcher of claim 11, wherein the latch is configured to receive a write clock signal, receive a delayed write clock signal, and provide a column enable signal based on the write clock signal, the delayed write clock signal, and the delayed input data signal.

16. A method comprising:
fabricating a latch that provides a column enable signal based on input clock signals and a delayed input data signal; and
fabricating a pulse stretcher that provides the delayed input data signal to the latch based on an input data signal and an enable signal,
wherein the input data signal has a first pulse width, and the delayed input data signal has a second pulse width that is at least greater than the first pulse width.

17. The method of claim 16, further comprising:
fabricating the pulse stretcher with a delay element that receives the input data signal and generates the delayed input data signal; and
fabricating the pulse stretcher with a multiplexer that receives the input data signal, receives the delayed input data signal, and selectively provides the input data signal or the delayed input data signal as output to the latch based on the enable signal.

18. The method of claim 17, wherein:
the multiplexer has a first input, a second input, and a single output, and
the enable signal is used as a multiplexer selection signal that selectively passes the input data signal from the first input to the single output or that selectively passes the delayed input data signal from the second input to the single output.

19. The method of claim 17, wherein the delay element has an inverter, a resistor, and a capacitor that are arranged to receive the input data signal, delay the input data signal, and provide the delayed input data signal to the multiplexer.

20. The method of claim 16, wherein:
the input clock signals have a write clock signal and a delayed write clock signal, and
the latch is configured to receive the write clock signal, receive the delayed write clock signal, and provide the column enable signal based on the write clock signal, the delayed write clock signal, and the delayed input data signal.

* * * * *